(12) United States Patent
Lee et al.

(10) Patent No.: US 12,256,504 B2
(45) Date of Patent: Mar. 18, 2025

(54) HOLDING SYSTEM FOR FOLDABLE DISPLAY DEVICE AND FOLDABLE DISPLAY SET INCLUDING THE SAME

(71) Applicant: LG Display Co., Ltd., Seoul (KR)

(72) Inventors: Jung-Dae Lee, Paju-si (KR); Seok-Hyo Cho, Paju-si (KR); Ji-Woon Min, Paju-si (KR); Yong-Joon Jeon, Paju-si (KR); Sang-Yong Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 227 days.

(21) Appl. No.: 17/978,650

(22) Filed: Nov. 1, 2022

(65) Prior Publication Data

US 2023/0209744 A1    Jun. 29, 2023

(30) Foreign Application Priority Data

Dec. 27, 2021  (KR) .......................... 10-2021-0188230

(51) Int. Cl.
*H05K 5/02*       (2006.01)
*H10K 77/10*      (2023.01)
*H10K 102/00*     (2023.01)

(52) U.S. Cl.
CPC ......... *H05K 5/0217* (2013.01); *H10K 77/111* (2023.02); *H10K 2102/311* (2023.02)

(58) Field of Classification Search
CPC ... G06F 1/1652; G06F 1/1601; H10K 77/111; H10K 2102/311; H10K 59/12; G09F 9/301; G09F 9/35; G09F 11/02; G09F 11/08; H05K 1/028; H05K 2201/051; H05K 5/0217
See application file for complete search history.

(56) References Cited

U.S. PATENT DOCUMENTS

| 2018/0114471 | A1* | 4/2018 | Park ....................... G06F 1/1652 |
| 2019/0200470 | A1* | 6/2019 | Woo ....................... G06F 1/1679 |
| 2019/0258295 | A1* | 8/2019 | Fujimoto .................. G09F 9/00 |
| 2019/0324501 | A1* | 10/2019 | Kim ....................... H05K 5/0017 |
| 2020/0137905 | A1* | 4/2020 | Redeker ................ G06F 1/1601 |

FOREIGN PATENT DOCUMENTS

KR   10-2019-0071119 A   6/2019
KR   10-2020-0044288 A   4/2020

* cited by examiner

*Primary Examiner* — Jacob R Crum
(74) *Attorney, Agent, or Firm* — Morgan, Lewis & Bockius LLP

(57) ABSTRACT

A foldable display set may include: a foldable display device; and a holding system on a rear surface of the foldable display device and configured to fold and unfold the foldable display device. The holding system may include: a motor configured to generate a rotational force; a rotational arm configured to be rotated by the rotational force of the motor to fold and unfold the foldable display device; a fixing plate spaced apart from the rotational arm with the foldable display device in an unfolded state; a moving plate on the fixing plate and configured to be moved with respect to the fixing plate by the rotational arm; and a magnetic unit fixed on the moving plate. The foldable display device in a folded state may be fixed to the magnetic unit via a magnetic force.

22 Claims, 15 Drawing Sheets

HOLDING SYSTEM FOR FOLDABLE DISPLAY DEVICE AND FOLDABLE DISPLAY SET INCLUDING THE SAME

CROSS-REFERENCE TO RELATED APPLICATION

The present application claims the priority of Korean Patent Application No. 10-2021-0188230 filed on Dec. 27, 2021, which is hereby incorporated by reference in its entirety.

BACKGROUND

1. Technical Field

The present disclosure relates to a foldable display device, and more particularly, to a holding system for a large foldable display device and a foldable display set including the same.

2. Description of the Related Art

An electroluminescent display device is one of flat panel display devices. It has a wide viewing angle as compared with a liquid crystal display device because it is self-luminous. It is also thin, light weight, and low in power consumption because a backlight unit is not necessary. In addition, an electroluminescent display device may be driven by low voltages of direct current (DC) and has a fast response time. An electroluminescent display device is also resistant to external impacts and may be used in a wide range of temperatures because its components are solids. An electroluminescent display device may also be manufactured at low cost.

Recently, a foldable display device, which can be freely folded and unfolded by forming components of the electroluminescent display device on a flexible substrate, has been widely developed and applied to various fields.

The foldable display device may be in an unfolded state to provide a wide screen when displaying an image and may be in a folded state to reduce its size when not displaying an image, thereby having advantages of convenient transportation and/or storage.

A hinge structure is widely applied to a foldable display panel to maintain the unfolded state and the folded state of the foldable display device. The hinge structure can stably maintain the unfolded and folded states in a small foldable display device, such as a smart phone. However, where the hinge structure is applied to a foldable display device with a larger area of, for example, 40 inches or more in diagonal length, the foldable display panel is more likely to be damaged during the folding or unfolding process and/or a transporting process. This is because a typical foldable display panel uses a large repulsive force to be unfolded and is less rigid compared to a general display panel.

SUMMARY

Accordingly, embodiments of the present disclosure are directed to a holding system for a large foldable display device and a foldable display set including the same that substantially obviate one or more of the problems due to the limitations and disadvantages of the related art.

More specifically, an object of the present disclosure is to provide a holding system for a large foldable display device capable of stably maintaining a folded state and an unfolded state and a foldable display set including the same.

The features and aspects of the present disclosure are not limited to those described above. Additional features and advantages of the disclosure will be set forth in the description which follows, and in part will be apparent to those skilled in the art from the description or may be learned by practice of the disclosure. These and other advantages of the disclosure may be realized and attained by the structure particularly pointed out in, or derivable from, the written description, claims hereof, and the appended drawings.

To achieve these and other advantages of the present disclosure and in accordance with the purpose of the disclosure, as embodied and broadly described herein, a foldable display set may comprise: a foldable display device; and a holding system on a rear surface of the foldable display device and configured to fold and unfold the foldable display device. The holding system may include: a motor configured to generate a rotational force; a rotational arm configured to be rotated by the rotational force of the motor to fold and unfold the foldable display device; a fixing plate spaced apart from the rotational arm with the foldable display device in an unfolded state; a moving plate on the fixing plate and configured to be moved with respect to the fixing plate by the rotational arm; and a magnetic unit fixed on the moving plate. The foldable display device in a folded state may be fixed to the magnetic unit via a magnetic force.

In another aspect of the present disclosure, a holding system for a foldable display device may comprise: a frame; a motor housed in the frame and configured to generate a rotational force; a rotational arm configured to be rotated by the rotational force of the motor; a fixing plate connected to the frame and spaced apart from the rotational arm; a moving plate on the fixing plate and configured to be moved with respect to the fixing plate by the rotational arm; and a magnetic unit fixed on the moving plate. The moving plate and the magnetic unit may be configured to be moved by the rotational arm between a first position and a second position with respect to the fixing plate.

It is to be understood that both the foregoing general description and the following detailed description are explanatory and by way of examples and are intended to provide further explanation of the disclosure as claimed without limiting its scope.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Reference will now be made in detail to embodiments of the present disclosure, examples of which are illustrated in the accompanying drawings.

Figure 1:
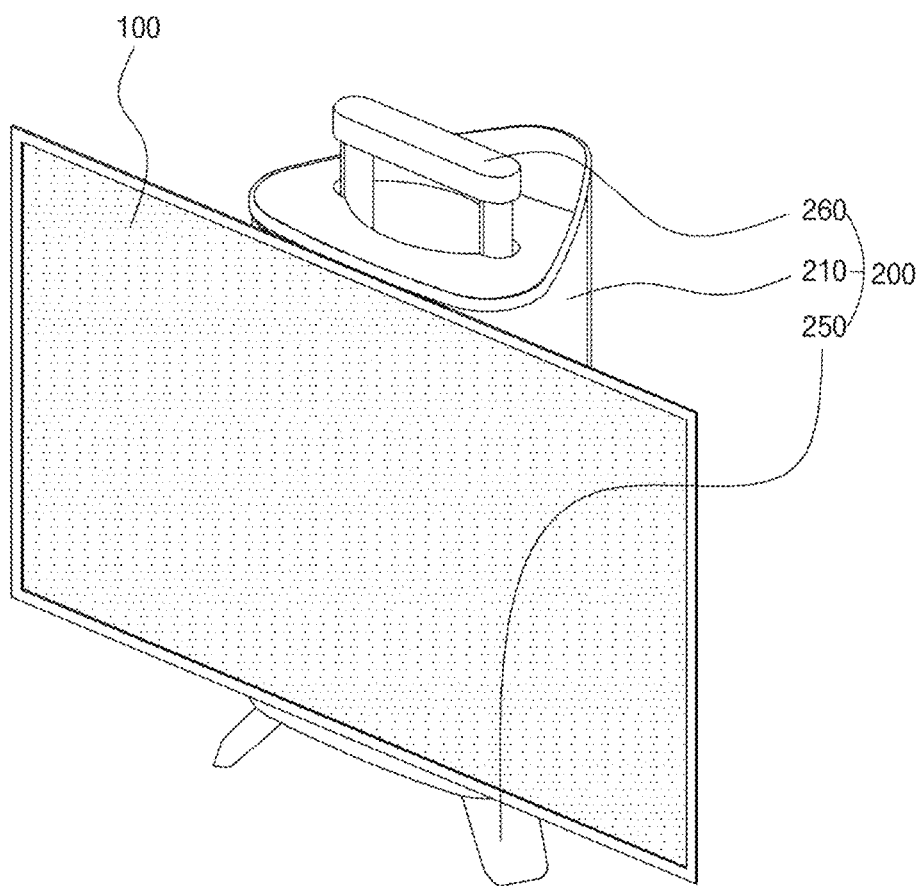
FIG. 1 is a view schematically illustrating a foldable display set in an unfolded state according to an example embodiment of the present disclosure from the front side.
Figure 2:
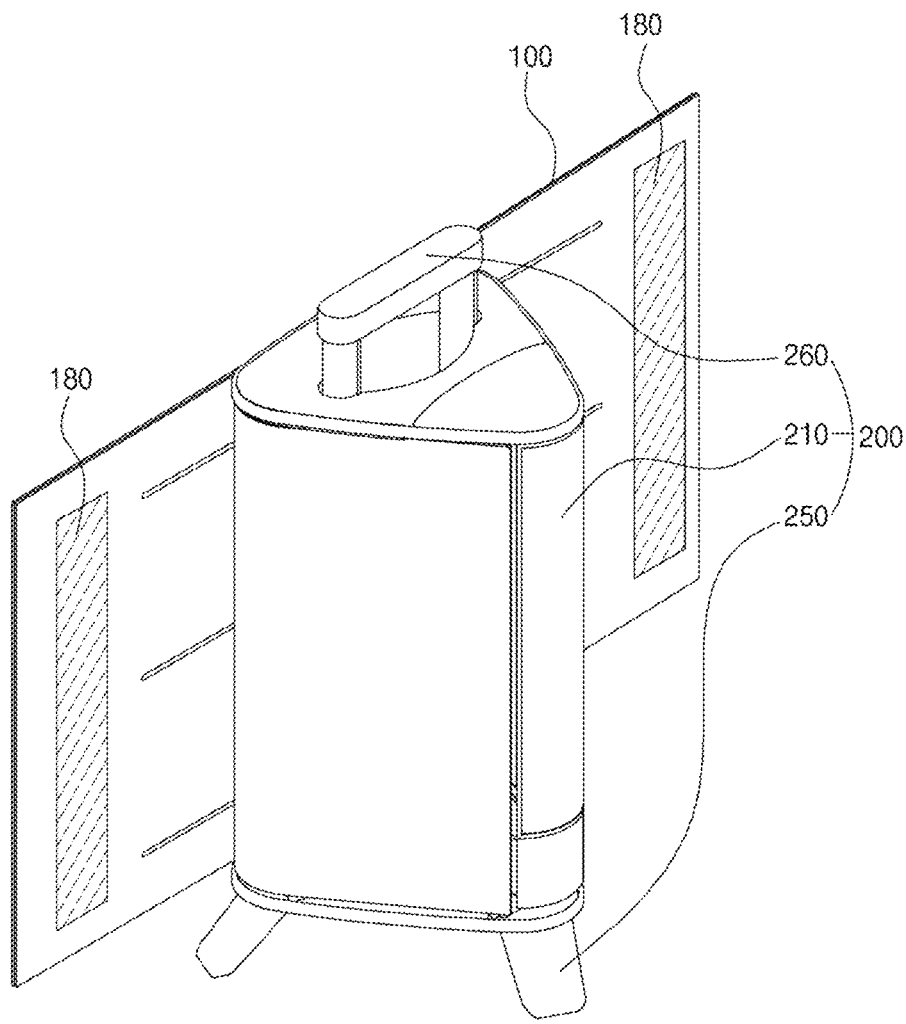
FIG. 2 is a view schematically illustrating the foldable display set in the unfolded state according to an example embodiment of the present disclosure from the back side.
Figure 3:
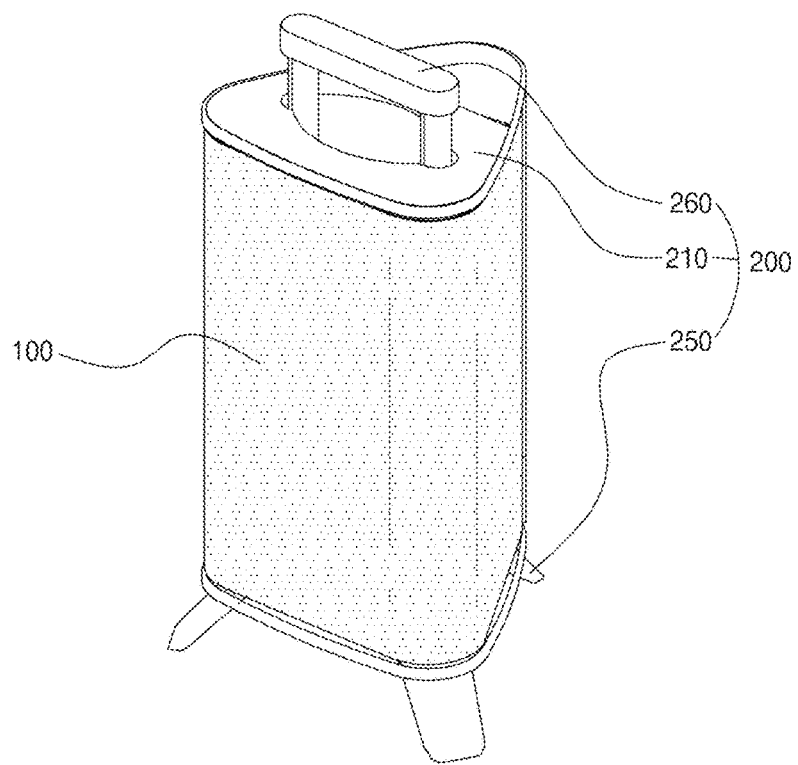
FIG. 3 is a view schematically illustrating the foldable display set in a folded state according to an example embodiment of the present disclosure from the front side.

FIGS. 1 to 3 are views schematically illustrating a foldable display set according to an example embodiment of the present disclosure. FIG. 1 shows the foldable display set in an unfolded state from the front side, FIG. 2 shows the foldable display set in the unfolded state from the back side, and FIG. 3 shows the foldable display set in a folded state from the front side.

As illustrated in FIGS. 1 to 3, the foldable display set according to an example embodiment of the present disclosure may include a foldable display device 100 and a holding system 200.

The foldable display device 100 may have a relatively large size of, for example, 40 inches or more in diagonal length. A center of a rear surface of the foldable display device 100 may be fixed to the holding system 200. Metal plates 180 may be provided on the rear surface of the foldable display device 100 near both ends thereof, for example, near left and right ends, respectively.

The holding system 200 may include a holder 210, a support portion 250, and a handle portion 260.

The holder 210 is a body part on which the foldable display device 100 may be fixed and may have a prism shape including a front surface and two side surfaces, that is, a triangular pillar shape. The rear surface of the foldable display device 100 may be fixed to the front surface of the holder 210. A plurality of components for folding or unfolding the foldable display device 100 may be provided inside the holder 210 and may be surrounded and protected by a cover. These components will be described in more detail later.

The support portion 250 may be provided at a lower end of the holder 210 to support the holder 210. The support portion 250 may include at least three legs, and each leg may be provided at a respective portion where two surfaces of the holder 210 meet.

The handle portion 260 may be provided at an upper end of the holder 210. The handle portion 260 may be used to move the foldable display device 100, for example, in the folded state.

As shown in FIGS. 1 and 2, the foldable display device 100 may display an image in the unfolded state in which the center portion may be fixed to the front surface of the holder 210 and both ends may be disposed on the same plane as the center portion so that a display surface is flat.

On the other hand, as shown in FIG. 3, when the foldable display device 100 is in the folded state, the center portion thereof may be fixed to the front surface of the holder 210, and both ends thereof may be fixed to the side surfaces of the holder 210, thereby forming a substantially triangular pillar shape. Accordingly, it is possible to store and/or move the foldable display device 100 more conveniently by reducing the size. In this case, the metal plates 180 of the foldable display device 100 may be fixed to magnetic units inside the holder 210, and this will be described in detail later.

Figure 4:
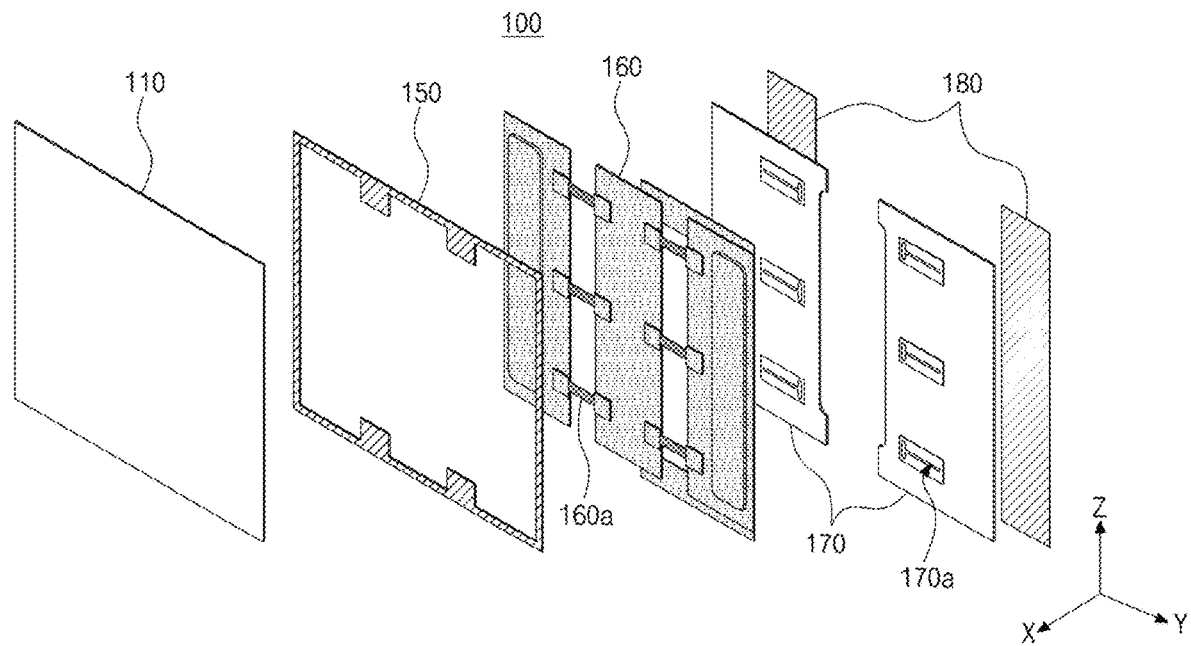
FIG. 4 is an exploded perspective view schematically illustrating the foldable display device according to an example embodiment of the present disclosure.
Figure 5:
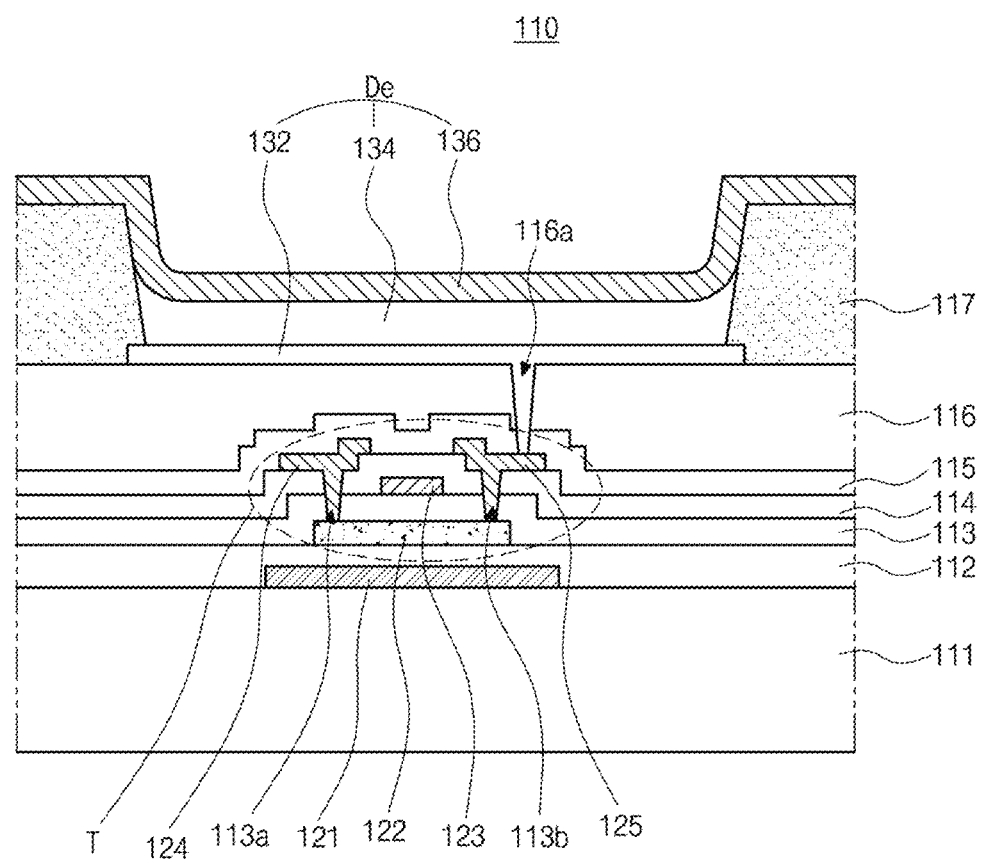
FIG. 5 is a schematic cross-sectional view of a display panel of the foldable display device according to an example embodiment of the present disclosure.

FIG. 4 is an exploded perspective view schematically illustrating the foldable display device according to an example embodiment of the present disclosure. FIG. 5 is a schematic cross-sectional view of a display panel of the foldable display device according to an example embodiment of the present disclosure and shows one pixel region.

In FIG. 4, the foldable display device 100 according to an example embodiment of the present disclosure may include a display panel 110, a middle cabinet 150, a back cover 160 and 170, and metal plates 180.

The display panel 110 may display an image. The display panel 110 may be an electroluminescent display panel including a light-emitting diode and a thin film transistor.

Specifically, as illustrated in FIG. 5, a shield pattern 121 of a conductive material, such as metal, may be formed on a substrate 111. The substrate 111 may be formed of a material having flexibility and may be a glass substrate or a plastic substrate. For example, polyimide may be used as the plastic substrate, but the embodiments or the present disclosure are not limited thereto.

The shield pattern 121 may be formed of at least one of aluminum (Al), copper (Cu), molybdenum (Mo), titanium (Ti), chromium (Cr), nickel (Ni), tungsten (W), and an alloy thereof and may have a single-layer or multiple-layer structure. For example, the shield pattern 121 may have a double-layer structure including a lower layer of molybdenum titanium (MoTi) and an upper layer of copper (Cu), and the upper layer may have a larger thickness than the lower layer.

A buffer layer 112 of an insulating material may be formed on the shield pattern 121. The buffer layer 112 may be disposed substantially on an entire surface of the substrate 111. The buffer layer 112 may be formed of an inorganic material, such as silicon oxide ($SiO_2$) or silicon nitride (SiNx), and may include a single layer or multiple layers.

A semiconductor layer 122 may be formed on the buffer layer 112 and be patterned. The semiconductor layer 122 may be disposed to overlap the shield pattern 121. The semiconductor layer 122 may be formed of an oxide semiconductor material. In this case, the shield pattern 121 may block light incident on the semiconductor layer 122 and may help prevent the semiconductor layer 122 from deteriorating due to such incident light.

Alternatively, the semiconductor layer 122 may be formed of polycrystalline silicon, and both ends of the semiconductor layer 122 may be doped with impurities. In this case, the shield pattern 121 may be omitted.

A gate insulation layer 113 of an insulating material may formed on the semiconductor layer 122 substantially over the entire surface of the substrate 111. The gate insulation layer 113 may be formed of an inorganic insulating material, such as silicon oxide ($SiO_2$) or silicon nitride (SiNx). If the semiconductor layer 122 is made of an oxide semiconductor material, the gate insulation layer 113 may be formed of silicon oxide ($SiO_2$). Alternatively, if the semiconductor layer 122 is made of polycrystalline silicon, the gate insulation layer 113 may be formed of silicon oxide ($SiO_2$) or silicon nitride (SiNx).

A gate electrode 123 of a conductive material, such as metal, may be formed on the gate insulation layer 113 corresponding to the center of the semiconductor layer 122. The gate electrode 123 may be formed of at least one of aluminum (Al), copper (Cu), molybdenum (Mo), titanium (Ti), chromium (Cr), nickel (Ni), tungsten (W), and an alloy thereof and may have a single-layer or multiple-layer structure. For example, the gate electrode 123 may have a double-layer structure including a lower layer of molybdenum titanium (MoTi) and an upper layer of copper (Cu), and the upper layer may have a larger thickness than the lower layer.

In addition, a gate line (not shown) may be formed on the gate insulation layer 113 through the same process as the gate electrode 123. The gate line may extend in a first direction and may be connected to the gate electrode 123.

In an example embodiment of the present disclosure, the gate insulation layer 113 may be formed substantially over the entire surface of the substrate 111. However, alternatively, the gate insulation layer 113 may be patterned to have the same shape as the gate electrode 123.

An interlayer insulation layer 114 made of an insulating material may be formed on the gate electrode 123 substantially over the entire surface of the substrate 111. The interlayer insulation layer 114 may be formed of an inorganic insulating material, such as silicon oxide ($SiO_2$) or silicon nitride (SiNx). Alternatively, the interlayer insulation layer 114 may be formed of an organic insulating material, such as photo acryl or benzocyclobutene.

The interlayer insulation layer 114 may have first and second contact holes 113a and 113b respectively exposing a top surface of the semiconductor layer 122 near both ends. The first and second contact holes 113a and 113b may be disposed respectively at both sides of the gate electrode 123 and may be spaced apart from the gate electrode 123. The first and second contact holes 113a and 113b may also be formed in the gate insulation layer 113. Alternatively, if the gate insulation layer 113 is patterned to have the same shape as the gate electrode 123, the first and second contact holes 113a and 113b may be formed only in the interlayer insulation layer 114.

Source and drain electrodes 124 and 125 of a conductive material, such as metal, may be formed on the interlayer insulation layer 114. The source and drain electrodes 124 and 125 may be formed of at least one of aluminum (Al), copper (Cu), molybdenum (Mo), titanium (Ti), chromium (Cr), nickel (Ni), tungsten (W), and an alloy thereof and may have a single-layer or multiple-layer structure. For example, the source and drain electrodes 124 and 125 may have a double-layer structure including a lower layer of molybdenum titanium (MoTi) and an upper layer of copper (Cu), and the upper layer may have a larger thickness than the lower layer. Alternatively, the source and drain electrodes 124 and 125 may have a triple-layer structure.

In addition, a data line (not shown) and a power supply line (not shown) may be further formed on the interlayer insulation layer 114 and may be formed through the same process as the source and drain electrodes 124 and 125.

The source and drain electrodes 124 and 125 may be spaced apart from each other with the gate electrode 123 positioned therebetween and may be in contact with both ends of the semiconductor layer 122 through the first and second contact holes 113a and 113b, respectively.

Although not shown in the figure, the data line may extend in a second direction and crossed the gate line, thereby defining a pixel region. The power supply line for supplying a high potential voltage may be spaced apart from the data line.

The semiconductor layer 122, the gate electrode 123, and the source and drain electrodes 124 and 125 may form a thin film transistor T. The thin film transistor T may have a coplanar structure in which the gate electrode 123 and the source and drain electrodes 124 and 125 are located at the same side with respect to the semiconductor layer 122.

Alternatively, the thin film transistor T may have an inverted staggered structure in which the gate electrode and the source and drain electrodes are located at different sides with respect to the semiconductor layer. That is, the gate electrode may be disposed under the semiconductor layer, and the source and drain electrodes may be disposed over the semiconductor layer. The semiconductor layer may be formed of oxide semiconductor or amorphous silicon.

Meanwhile, one or more thin film transistors having substantially the same structure as the thin film transistor T can be further formed on the substrate 111.

A passivation layer 115 of an insulating material may be formed on the source and drain electrodes 124 and 125 substantially over the entire surface of the substrate 111. The passivation layer 115 may be formed of an inorganic insulating material, such as silicon oxide ($SiO_2$) or silicon nitride (SiNx).

A planarization layer 116 of an insulating material may be formed on the passivation layer 115 substantially over the entire surface of the substrate 111. The planarization layer 116 may be formed of an organic insulating material, such as photo acryl or benzocyclobutene. The planarization layer 116 may have a flat top surface.

The planarization layer 116 and the passivation layer 115 may have a drain contact hole 116a exposing the drain electrode 125. The drain contact hole 116a may be spaced apart from the second contact hole 113b. Alternatively, the drain contact hole 116a may be disposed right over the second contact hole 113b.

A first electrode 132 may formed on the planarization layer 116 and may be formed of a conductive material having relatively high work function. The first electrode 132 may be disposed in the pixel region and be in contact with the drain electrode 125 through the drain contact hole 116a. For example, the first electrode 132 may be formed of a transparent conductive material, such as indium tin oxide (ITO) or indium zinc oxide (IZO), but is not limited thereto.

The electroluminescent display panel according to an example embodiment of the present disclosure may be a top emission type in which a light-emitting diode is configured to output light toward a direction away from the substrate 111. Accordingly, the first electrode 132 may further include a reflective electrode or a reflective layer, formed of a metal material having a relatively high reflectance, below the transparent conductive material. For example, the reflective electrode or reflective layer may be formed of an aluminum-palladium-copper (APC) alloy, silver (Ag), or aluminum (Al). The first electrode 132 may have a triple-layer structure of ITO/APC/ITO, ITO/Ag/ITO or ITO/Al/ITO, but is not limited thereto.

A bank 117 of an insulating material may be formed on the first electrode 132. The bank 117 may overlap and cover lateral edges of the first electrode 132 and may expose a central portion of the first electrode 132.

At least a top surface of the bank 117 may be hydrophobic, and a side surface of the bank 117 may be hydrophobic or hydrophilic. The bank 117 may be formed of an organic insulating material having a hydrophobic property. Alternatively, the bank 117 may be formed of an organic insulating material having a hydrophilic property and may be subjected to a hydrophobic treatment.

In an example embodiment of the present disclosure, the bank 117 may have a single structure including a single bank. However, the bank 117 may have a dual structure. That is, the bank 117 may have a dual structure including a hydrophilic bank of a lower portion and a hydrophobic bank of an upper portion.

Next, a light-emitting layer 134 may be formed on the first electrode 132 exposed through the bank 117.

Although not shown in the figure, the light-emitting layer 134 may include a first charge auxiliary layer, a light-emitting material layer, and a second charge auxiliary layer sequentially disposed over the first electrode 132. The light-emitting material layer may be formed of any one of red, green, and blue luminescent materials, but is not limited thereto. The luminescent material may be an organic luminescent material, such as a phosphorescent compound or a fluorescent compound, or may be an inorganic luminescent material, such as a quantum dot.

The first charge auxiliary layer may be a hole auxiliary layer, and the hole auxiliary layer may include at least one of a hole injecting layer (HIL) and a hole transporting layer (HTL). In addition, the second charge auxiliary layer may be an electron auxiliary layer, and the electron auxiliary layer may include at least one of an electron injecting layer (EIL) and an electron transporting layer (ETL). However, the present disclosure is not limited thereto.

The light-emitting layer 134 may be formed through a solution process or an evaporation process. If the light-emitting layer 134 is formed through the solution process, a height of the light-emitting layer 134 in the region adjacent to the bank 117 may rise higher closer to the bank 117.

A second electrode 136 of a conductive material having relatively low work function may be formed on the light-emitting layer 134 substantially over the entire surface of the substrate 111. The second electrode 136 may be formed of aluminum (Al), magnesium (Mg), silver (Ag), or an alloy thereof. The second electrode 136 may have a relatively small thickness such that light from the light-emitting layer 134 may be transmitted therethrough. Alternatively, the second electrode 136 may be formed of a transparent conductive material, such as indium-gallium-oxide (IGO), but is not limited thereto.

The first electrode 132, the light-emitting layer 134, and the second electrode 136 may constitute a light-emitting diode De. The first electrode 132 may serve as an anode, and the second electrode 136 may serve as a cathode, but the present disclosure is not limited thereto.

As described above, the electroluminescent display panel according to an example embodiment of the present disclosure may be a top emission type display panel in which light from the light-emitting layer 134 of the light-emitting diode De is output toward a direction away from the substrate 111, that is, output to the outside through the second electrode 136. The top emission type display panel may have a wider emission area than a bottom emission type display panel of the same size, to thereby improve luminance and reduce power consumption.

In addition, an encapsulation layer (not shown) may be formed on the second electrode 136 substantially over the entire surface of the substrate 111 to block moisture or oxygen introduced from the outside, thereby protecting the light-emitting diode De.

As shown in FIG. 4, the middle cabinet 150 may be disposed on a rear surface of the display panel 110 with respect to an X direction. The middle cabinet 150 may support the display panel 110 and may have a rectangular frame shape. The middle cabinet 150 may be formed of metal or plastic.

The back cover 160 and 170 may be disposed on a rear surface of the middle cabinet 150. The back cover 160 and 170 may protect the display panel 110 and may include a first back cover 160 and a second back cover 170 to implement folding characteristics. The first back cover 160 may be disposed between the middle cabinet 150 and the second back cover 170.

In addition, each of the first back cover 160 and the second back cover 170 may be formed of a plurality of separated parts to improve the folding characteristics. For example, the first back cover 160 may be separated into three parts connected by elastic springs 160a and may further include portions connecting upper and lower ends on a rear surface thereof. On the other hand, the second back cover 170 may be separated into two parts. A plurality of guide rails 170a, which extend in a Y direction and are spaced apart from each other in a Z direction, may be provided in each part of the second back cover 170. However, the present disclosure is not limited thereto. The first and second back covers 160 and 170 may have various alternative structures capable of improving the folding characteristics.

The first back cover 160 may be formed of plastic or metal. For example, the metal may be aluminum or stainless steel.

Meanwhile, the second back cover 170 may be formed of metal. For example, the second back cover 170 may be formed of aluminum.

Two metal plates 180 may be disposed on a rear surface of the second back cover 170. The metal plates 180 may extend in the Z direction and may be spaced apart from each other in the Y direction. Each metal plate 180 may be disposed between the edge of the second back cover 170 and the guide rails 170*a*, may be spaced apart from the guide rails 170*a*, and may be fixed to the rear surface of the second back cover 170. In this case, the metal plates 180 may be attached to the rear surface of the second back cover 170 through an adhesive member.

The metal plates 180 may be formed of a magnetic metal. For example, the metal plates 180 may be formed of iron (Fe), nickel (Ni), or cobalt (Co), but is not limited thereto.

The configuration of the holder for fixing the foldable display device 100 in the unfolded state and the folded state will be described in more detail with reference to FIGS. 6 to 8.

Figure 6:
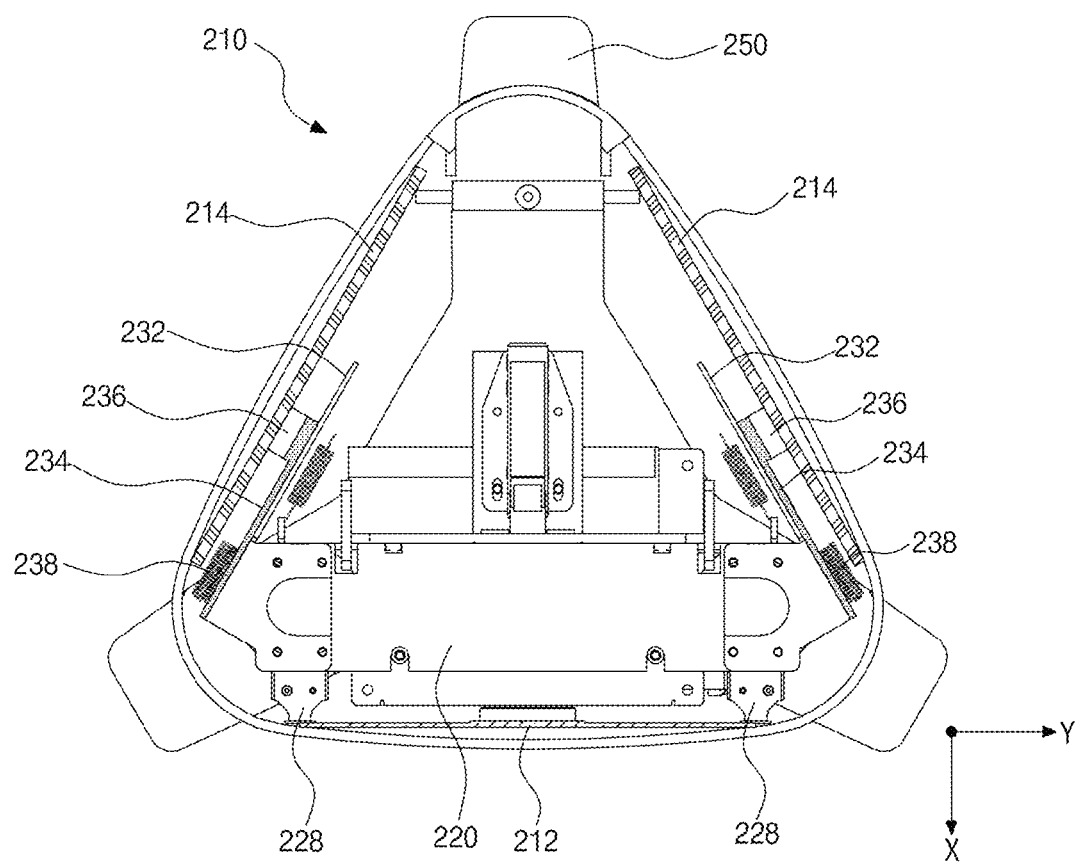
FIG. 6 is a schematic top view of a holder for the foldable display device according to an example embodiment of the present disclosure.

FIG. 6 is a schematic top view of the holder for the foldable display device according to an example embodiment of the present disclosure. FIG. 7 is a schematic perspective view of the holder for the foldable display device according to an example embodiment of the present disclosure. FIG. 8 is a schematic perspective view of the example holder illustrated in FIG. 7 excluding front and side plates. FIG. 7 and FIG. 8 show the support portion under the holder together, and the holder will be described together with reference to FIG. 4.

Figure 7:
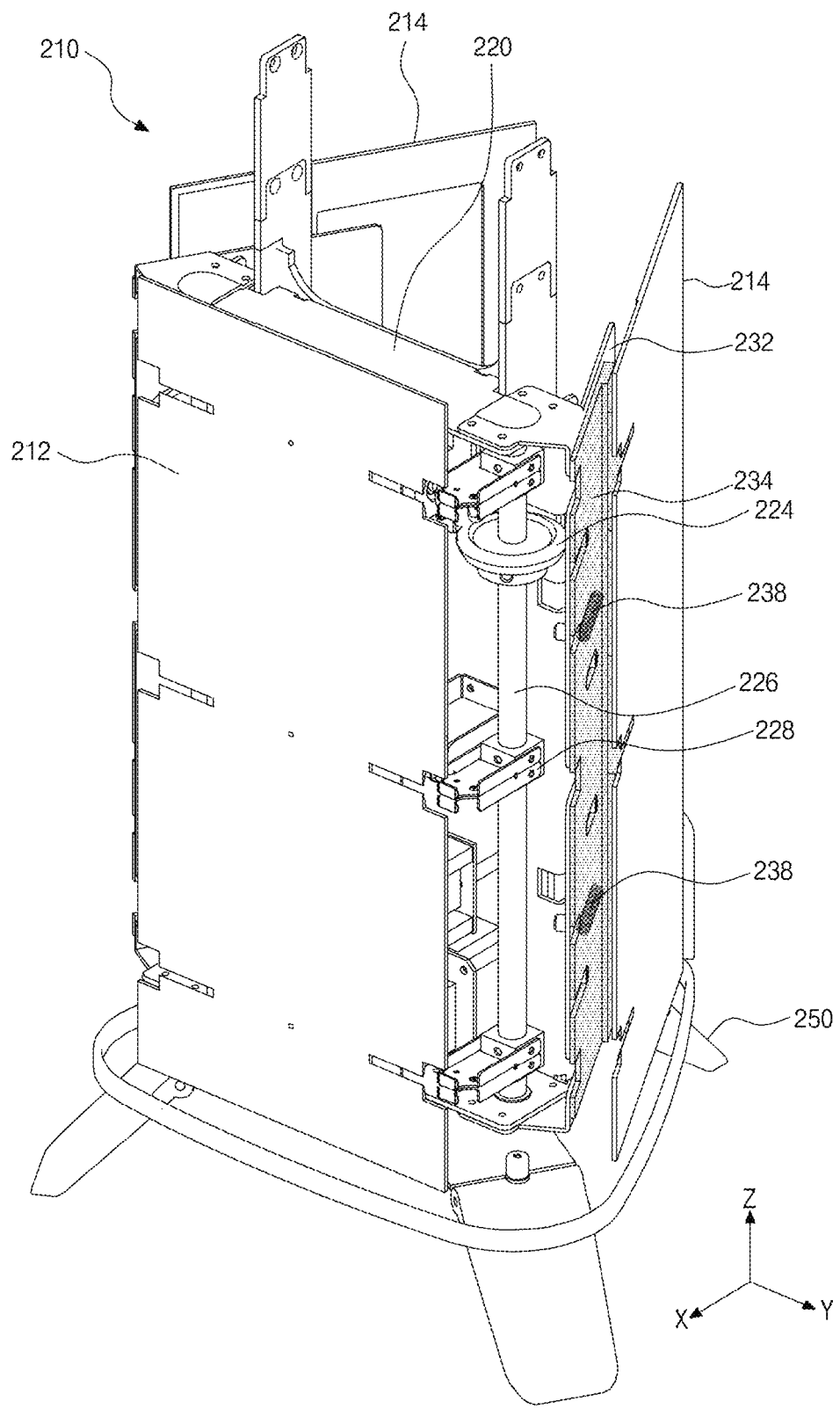
FIG. 7 is a schematic perspective view of the holder for the foldable display device according to an example embodiment of the present disclosure.
Figure 8:
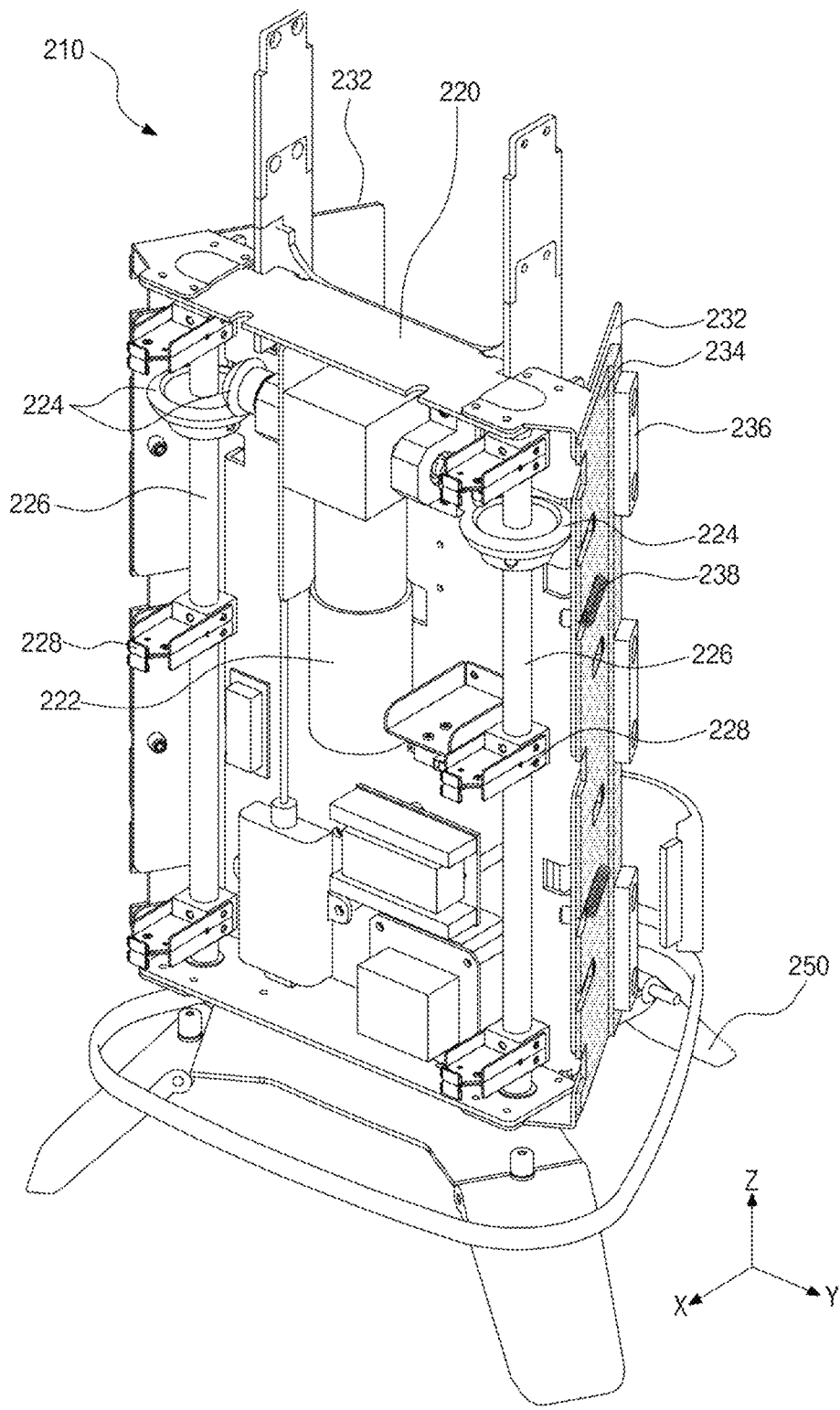
FIG. 8 is a schematic perspective view of the example holder in FIG. 7 excluding front and side plates.

As shown in FIGS. 6 to 8, the holder 210 according to an example embodiment of the present disclosure may include a shield portion, a driving portion, and a state conversion portion. The shield portion may include a front plate 212 and side plates 214. The driving portion may include a motor 222, gears 224, shafts 226, and rotational arms 228. The driving portion may also include a frame 220 to support or house various components, including, e.g., the motor 222, gears 224, and shafts 226. The state conversion portion may include fixing plates 232, moving plates 234, magnetic units 236, and restoration units 238. Here, the front plate 212 may be disposed at the front, the motor 222 may disposed at the center inside the holder 210, and other components may be disposed symmetrically in the Y direction with respect to the motor 222. For convenience of explanation, only one set of the symmetrical components will be described in more detail.

Specifically, the front plate 212 of the shield portion may be located on the front side of the holder 210, and the side plate 214 may be located on the side surface of the holder 210. Here, the front plate 212 may be parallel to the YZ plane in the context of the figure.

The front plate 212 may be a part to which the foldable display device 100 is assembled. The front plate 212 may maintain rigidity and may separate the foldable display device 100 from the driving portion so that the foldable display device 100 is prevented from being contaminated by particles from the motor 222 or the gear 224 of the driving portion. The front plate 212 may have holes corresponding to the guide rails 170*a* of the second back cover 170 of the foldable display device 100. The front plate 212 may be formed of plastic or metal.

The side plate 214 may serve as a partition between the metal plate 180 of the foldable display device 100 and the magnetic unit 236 for controlling the magnetic force of the magnetic units 236. The side plate 214 may be formed of plastic and may be omitted.

The driving portion and the state conversion portion may be located the inside of the holder 210 surrounded by the front plate 212 and the side plates 214.

Here, the motor 222 of the driving portion may be located in the center of the rear surface of the front plate 212 in the X direction. The motor 222 may generate a rotational force having a rotational axis in the Y direction.

The shaft 226 may be located at each of both sides of the motor 222 in the Y direction. The shaft 226 may extend in the Z direction and may rotate with respect to a rotational axis in the Z direction. The shaft 226 may be connected to the motor 222 through the gear 224.

The gear 224 may transmit the rotational force of the motor 222 to the shaft 226. The gear 224 may be a bevel gear that transmits power between two intersecting axes. The gear 224 may include a first gear connected to the motor 222 and a second gear connected to the shaft 226. The gear 224 may change the rotational force having the rotational axis in the Y direction from the motor 222 into the rotational force having the rotational axis in the Z direction and may transmit the rotational force to the shaft 226, thereby rotating the shaft 226 with respect to the rotational axis in the Z direction.

At least one rotational arm 228 may be connected to the shaft 226. The shaft 226 may transmit the rotational force of the motor 222 received from the gear 224 to the rotational arm 228. The rotational arm 228 may substantially have a length and a width in the XY plane and may be disposed such that the length is parallel to the X direction. When the shaft 226 rotates, the rotational arm 228 may rotate together on the XY plane.

For example, three rotational arms 228 may be connected to one shaft 226. However, the present disclosure is not limited thereto, and the number of the rotational arms 228 may be changed.

Next, the state conversion portion may be provided to be spaced apart from the shaft 226. As described above, the state conversion portion may include the fixing plate 232, the moving plate 234, the magnetic unit 236, and the restoration unit 238.

The fixing plate 232 may be fixed to the driving portion, e.g., to the frame 220. The fixing plate 232 may support the moving plate 234 and the magnetic unit 236. The fixing plate 232 may be formed of plastic or metal.

The moving plate 234 may be placed on the fixing plate 232 and may move horizontally relative to the fixing plate 232. The moving plate 234 may be formed of plastic or metal.

The fixing plate 232 and the moving plate 234 may be parallel to the side plate 214. That is, the fixing plate 232 and the moving plate 234 may be parallel to the side surface of the holder 210.

At least one magnetic unit 236 may be fixed to the moving plate 234. The position of the magnetic unit 236 may be changed by the movement of the moving plate 234. The magnetic unit 236 may be fixed to the moving plates 234 through a screw. However, the present disclosure is not limited thereto, and the magnetic unit 236 may be fixed to the moving plate 234 through an adhesive member or a structural fastening member.

The magnetic unit 236 may include a magnet. For example, the magnet may be formed of neodymium (Nd) and may be a Sarah magnet having a screw hole for fixing to the moving plate 234. However, the present disclosure is not limited thereto.

Although is the figures illustrate three magnetic units 236 provided on the moving plate 234, the present disclosure is not limited thereto. The number of the magnetic units 236 may vary.

Meanwhile, the restoration unit 238 may be connected to the fixing plate 232 and the moving plate 234. The restoration unit 238 may have an elastic force and may provide a restoring force to the moving plate 234 that has moved. For example, the restoration unit 238 may include one or more elastic springs, and two elastic springs may be provided between the fixing plate 232 and the moving plate 234.

Accordingly, when a force is applied, the moving plate 234 may move in one direction on the fixing plate 232, thereby changing the position of the magnetic unit 236. When the force is removed, the moving plate 234 may move on the fixing plate 232 in the opposite direction by the restoration unit 238, thereby returning the magnetic unit 236 to its original position.

The fixing plate 232 and the moving plate 234 may respectively include a plurality of holes and protrusions corresponding to each other for coupling and relative movement, which will be described in more detail later.

The movement of the moving plate 234 may be performed by the rotational arm 228. The rotational arm 228 of the holder 210 for the foldable display device according to an example embodiment of the present disclosure will be described in more detail with reference to FIG. 9.

Figure 9:
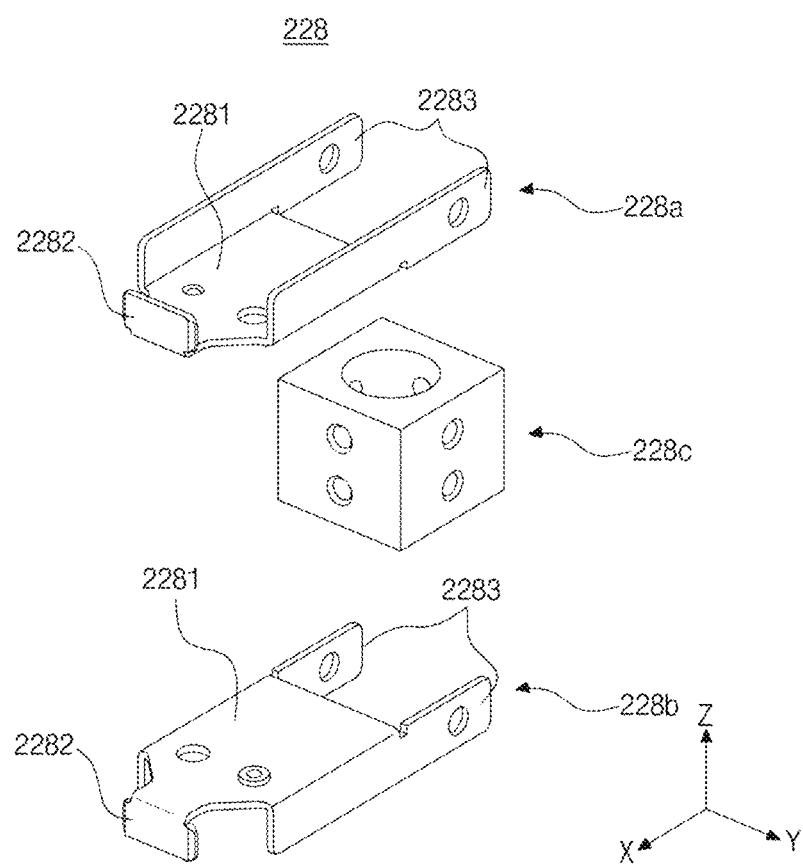
FIG. 9 is an exploded perspective view schematically illustrating a rotational arm of the holder for the foldable display device according to an example embodiment of the present disclosure.

FIG. 9 is an exploded perspective view schematically illustrating the rotational arm of the holder for the foldable display device according to an example embodiment of the present disclosure.

As illustrated in FIG. 9, the rotational arm 228 may include a first arm part 228a, a second arm part 228b, and a third arm part 228c.

The first arm part 228a and the second arm part 228b may be vertically disposed from each other along the Z direction in the illustrated orientation of the figure, may be symmetrical to each other with respect to the XY plane, and may be fixed to the third arm part 228c. Each of the first arm part 228a and the second arm part 228b may include first, second, and third parts 2281, 2282, and 2283.

The first part 2281 may be parallel to the XY plane, and a length in the X direction may be greater than a length in the Y direction, that is, a width.

Here, the first part 2281 may have a first end and a second end opposite each other in the X direction and a third end and a fourth end opposite each other in the Y direction. The second part 2282 may be connected to the first end of the first part 2281, and the third arm part 228c may be disposed at the second end of the first part 2281. In addition, the third parts 2283 may be connected to the third and fourth ends of the first part 2281, respectively. The second part 2282 and the third parts 2283 may be perpendicular to the first part 2281.

The second part 2282 may be a part coupled to the guide rail 170a of the second back cover 170 of the foldable display device 100 illustrated, e.g., in FIG. 4. In order to facilitate coupling, a width of the second part 2282 may be smaller than a width of the first part 2281 along the Y direction. In this case, the width of the first part 2281 may decrease toward the first end. Thus, a width of the first end of the first part 2281 may be smaller than a width of the second end.

The third parts 2283 may be parts fixed to the third arm part 228c, and a length of each third part 2283 may be longer than that of the first part 2281 in the X direction. In this case, the third parts 2283 may extend beyond the second end of the first part 2281. Accordingly, the third arm part 228c may be disposed between two third parts 2283.

The third arm part 228c may be a part fixed to the shaft 226 shown, e.g., in FIG. 8 and may have a hole through which the shaft 226 passes in the Z direction as illustrated, e.g., in FIG. 8. The third arm part 228c may have a substantially cube shape.

The first and second arm parts 228a and 228b of the rotational arm 228 may be disposed such that their respective first parts 2281 may be in contact with each other and be fixed to each other. The first and second arm parts 228a and 228b may be fixed to the third arm part 228c through their respective third parts 2283 and may be fixed to the shaft 226 shown, e.g., in FIG. 8 through the third arm part 228c. In this case, fastening members, such as screws, may be used for fixing. The respective first parts 2281 of the first and second arm parts 228a and 228b, the respective third parts 2283 of the first and second arm parts 228a and 228b, and the third arm part 228c may have holes corresponding to the fastening members.

Next, the fixing plate and moving plate according to an example embodiment of the present disclosure will be described in detail with reference to FIGS. 10-12.

Figure 10:
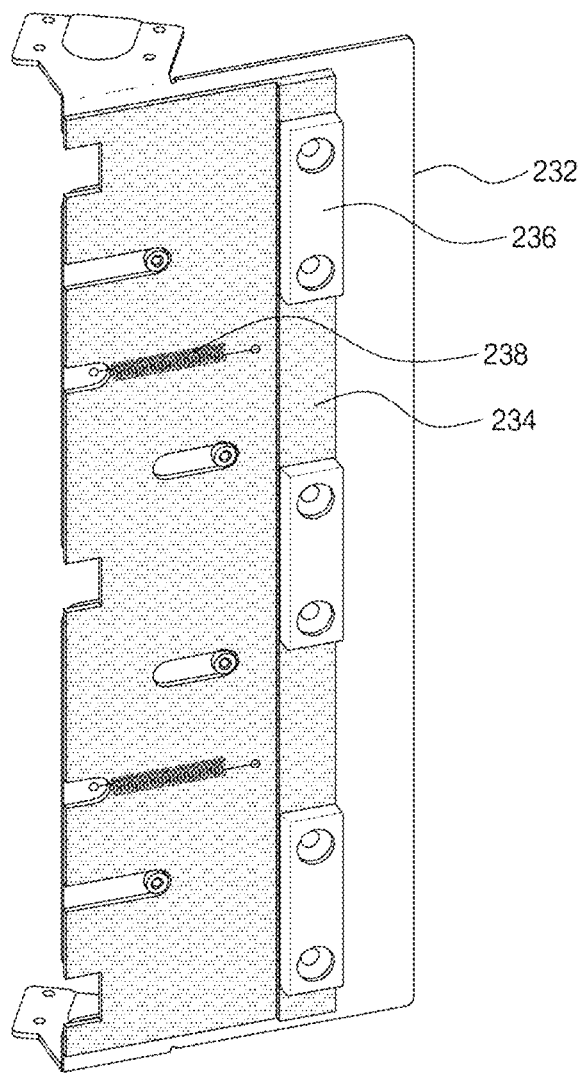
FIG. 10 is a view schematically illustrating a fixing plate and a moving plate attached to each other in the holder for the foldable display device according to an example embodiment of the present disclosure.

FIG. 10 is a view schematically illustrating the fixing plate and the moving plate attached to each other in the holder for the foldable display device according to an example embodiment of the present disclosure and shows the magnetic unit and the restoration unit together. FIG. 11 is a view schematically illustrating the fixing plate of the holder for the foldable display device according to an example embodiment of the present disclosure, and FIG. 12 is a view schematically illustrating the moving plate of the holder for the foldable display device according to an example embodiment of the present disclosure.

Figure 11:
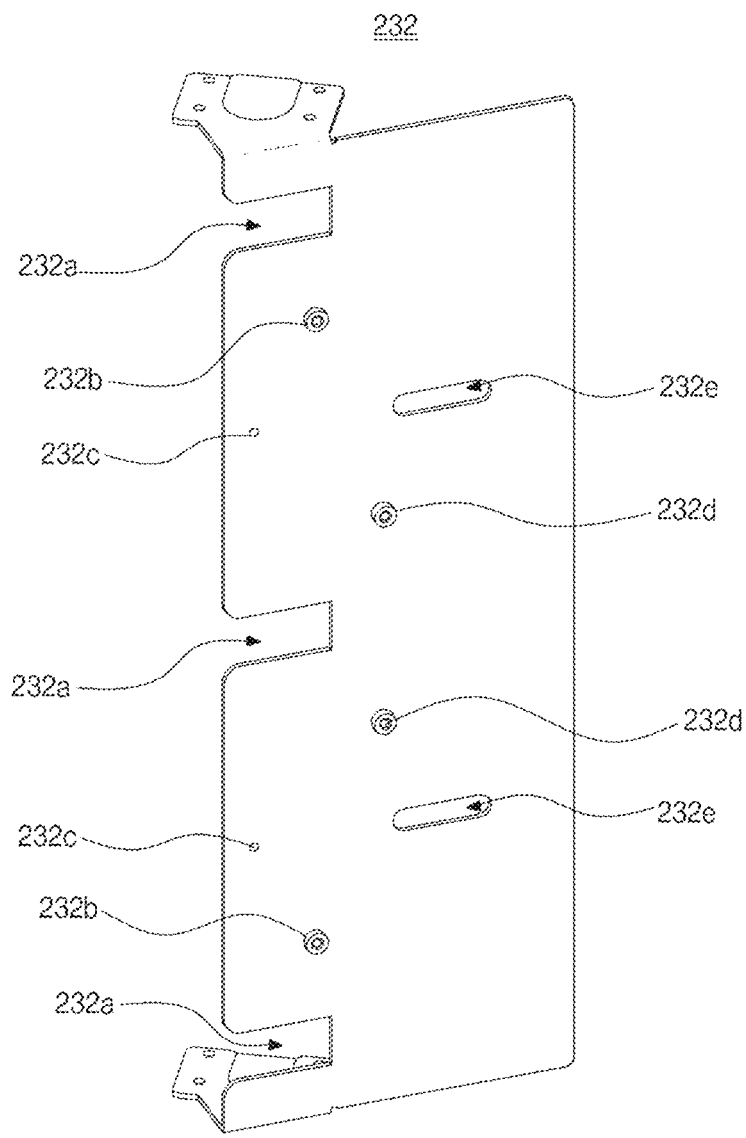
FIG. 11 is a view schematically illustrating the fixing plate of the holder for the foldable display device according to an example embodiment of the present disclosure.
Figure 12:
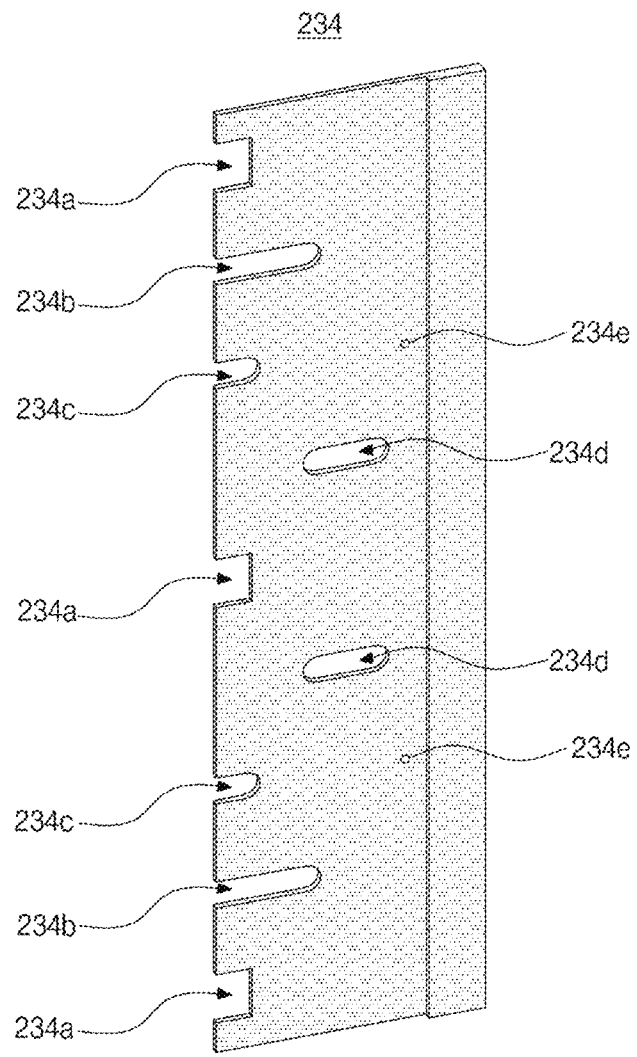
FIG. 12 is a view schematically illustrating the moving plate of the holder for the foldable display device according to an example embodiment of the present disclosure.

As shown in FIGS. 10-12, the moving plate 234 may be disposed on the fixing plate 232, the magnetic unit 236 may be fixed onto the moving plate 234, and the restoration unit 238 may be connected to the fixing plate 232 and the moving plate 234.

The fixing plate 232 may include at least one first fixing hole 232a, at least one first fixing protrusion 232b, at least one first connection part 232c, at least one second fixing protrusion 232d, and at least one second fixing hole 232e. The moving plate 234 may include at least one moving hole 234a, at least one first protrusion hole 234b, at least one connection hole 234c, at least one second protrusion hole 234d, and at least one second connection part 234e.

The first fixing hole 232a may correspond to the moving hole 234a. The first fixing protrusion 232b may correspond to the first protrusion hole 234b. The first connection part 232c may correspond to the connection hole 234c. The second fixing protrusion 232d may correspond to the second protrusion hole 234d. Also, although not shown in the figures, the second fixing hole 232e may correspond to a moving protrusion which may be provided on a rear surface of the moving plate 234. In addition, the second connection part 234e may correspond to the first connection part 232c and the connection hole 234c.

Each of the fixing plate 232 and the moving plate 234 may have a symmetrical structure in the vertical direction in the illustrated orientation of the figures.

The first fixing hole 232a may be provided at one lateral edge of the fixing plate 232 adjacent to the rotational arm 228, that is, a first lateral edge adjacent to the shaft 226 illustrated, e.g., in FIG. 8. One side of the fixing hole 232a may be open. The first fixing hole 232a may be disposed to correspond to the rotational arm 228 shown, e.g., in FIG. 8, and may serve as a movement path of the rotational arm 228 for the movement of the moving plate 234. Accordingly, the first fixing hole 232a may be provided in the same number as the rotational arm 228 illustrated, e.g., in FIG. 8. For example, one first fixing hole 232a may be disposed in each of upper, middle, and lower regions of the fixing plate 232. However, the present disclosure is not limited thereto, and the respective number of the first fixing hole 232a and of the rotational arm 228 shown, e.g., in FIG. 8, may vary depending on the size of the foldable display device 100 shown, e.g., in FIG. 4.

The first and second fixing protrusions 232b and 232d may be disposed to be spaced apart from each other vertically and horizontally between the adjacent first fixing holes 232a, for example, as illustrated in FIG. 11. The first connection part 232c and the second fixing hole 232e may be disposed to be spaced apart from each other horizontally between the first and second fixing protrusions 232b and 232d.

The first fixing protrusion 232b may be disposed in the first protrusion hole 234b of the moving plate 234 to prevent the moving plate 234 from being separated from the fixing plate 232 and to guide the movement of the moving plate 234.

The first connection part 232c may be exposed through the connection hole 234c of the moving plate 234 and may be connected to one end of the restoration unit 238. The first connection part 232c may be preferably disposed near the first edge of the fixing plate 232 adjacent to the shaft 226 shown, e.g., in FIG. 8.

The second fixing protrusion 232d may be disposed in the second protrusion hole 234d of the moving plate 234 to prevent the moving plate 234 from being separated from the fixing plate 232 and to guide the movement of the moving plate 234.

Meanwhile, as described above, the second fixing hole 232e may correspond to the moving protrusion (not shown) provided on the rear surface of the moving plate 234. Thus, the second fixing hole 232e may serve as a movement path of the moving protrusion. The second fixing hole 232e may be located at an inner portion of the fixing plate 232 and may have a closed shape.

Next, the moving hole 234a may be provided at one lateral edge of the moving plate 234 adjacent to the rotational arm 228, that is, at an edge adjacent to the shaft 226 shown, e.g., in FIG. 8. One side of the moving hole 234a may be open. The moving hole 234a may be disposed over the first fixing hole 232a to correspond to the rotational arm 228 shown, e.g., in FIG. 8. When the rotational arm 228 moves, the rotational arm 228 may be disposed in the first fixing hole 232a and the moving hole 234a and may apply a force to one side of the moving hole while rotating in the first fixing hole 232a, so that the moving plate 234 is moved. Thus, the horizontal length of the moving hole 234a may be smaller than that of the first fixing hole 232a.

The first and second protrusion holes 234b and 234d may be disposed to be spaced apart from each other vertically and horizontally between the adjacent moving holes 234a. The connection hole 234c and the second connection part 234e may be disposed to be spaced apart from each other horizontally between the first and second protrusion holes 234b and 234d.

The first protrusion hole 234b may be provided at one edge of the moving plate 234 adjacent to the shaft 226 (shown, e.g., in FIG. 8). One side of the first protrusion hole 234b may be open. The first protrusion hole 234b may serve as a movement path of the first fixing protrusion 232b of the fixing plate 232.

The connection hole 234c nay expose the first connection part 232c of the fixing plate 232. One side of the connection hole 234c may be open.

The second protrusion hole 234d may serve as a movement path of the second fixing protrusion of the fixing plate 232. The second protrusion hole 234d may be located in an inner portion of the moving plate 234 and may have a closed shape.

The second connection part 234e may be connected to the other end of the restoration unit 238 shown, e.g., in FIG. 10. It is preferable that the second connection part 234e be horizontally spaced apart from the connection hole 234c toward the other edge of the moving plate 234 away from the shaft 226 (shown, e.g., in FIG. 8).

Meanwhile, the magnetic unit 236 may be disposed on the moving plate 234 to be adjacent to the other edge of the moving plate 234. To fix the magnetic unit 236, a portion of the moving plate 234 where the magnetic unit 236 is disposed may be thicker than the other portions. However, the present disclosure is not limited thereto. Alternatively, the portion of the moving plate 234 where the magnetic unit 236 is disposed may have the same thickness as the other portions.

The moving plate 234 may horizontally move on the fixing plate 232 by rotation of the rotational arm 228 (shown, e.g., in FIG. 8), thereby changing the position of the magnetic unit 236. In addition, the rotational arm 228 may change the state of the foldable display device 100 (shown, e.g., in FIG. 4) by rotating, and the foldable display device 100 in the folded state may be stably fixed by the magnetic unit 236.

The change between the unfolded state and the folded state of the foldable display device 100 (shown, e.g., in FIG. 4) will described in more detail with reference to FIGS. 13 to 18.

Figure 13:
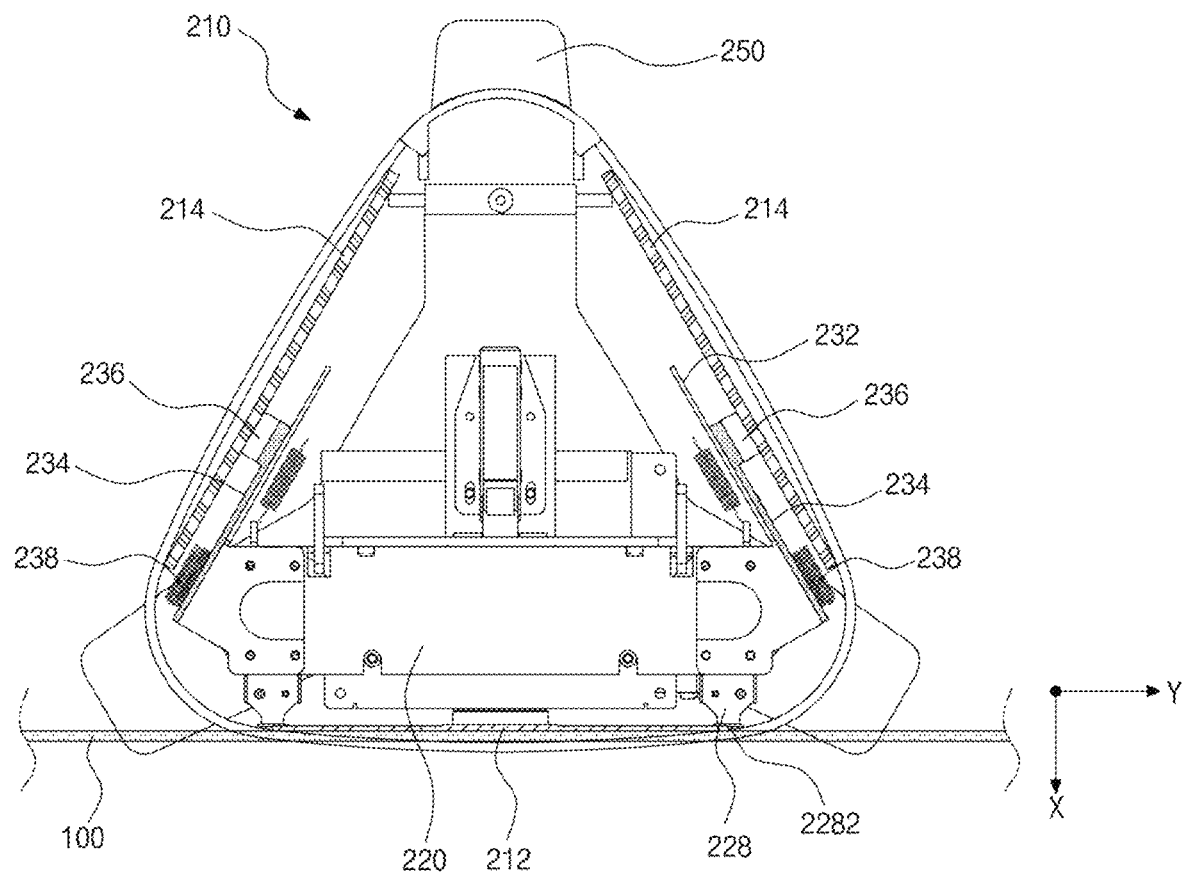
FIG. 13 is a schematic top view of the foldable display device and the holder in the unfolded state according to an example embodiment of the present disclosure.
Figure 14:
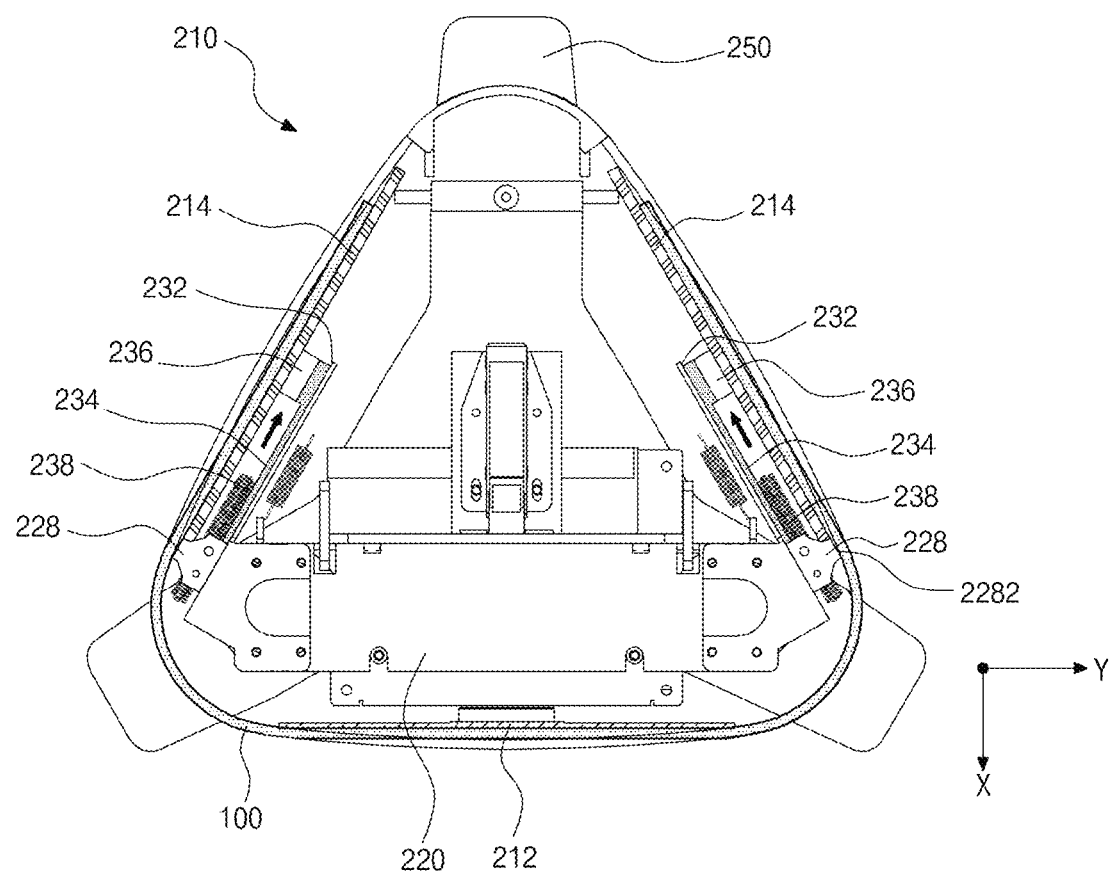
FIG. 14 is a schematic top view of the foldable display device and the holder in the folded state according to an example embodiment of the present disclosure.
Figure 15:
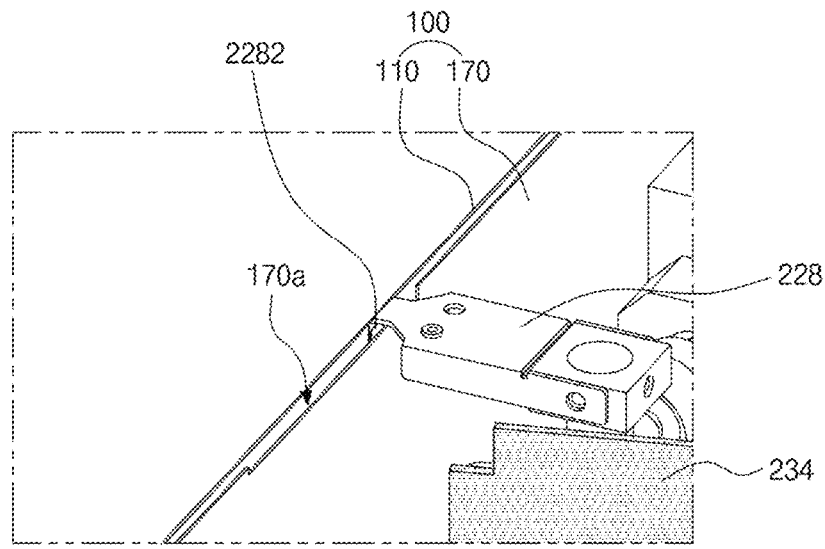
FIG. 15 is a view schematically illustrating a coupling relationship between the foldable display device and the rotational arm in the unfolded state according to an example embodiment of the present disclosure.
Figure 16:
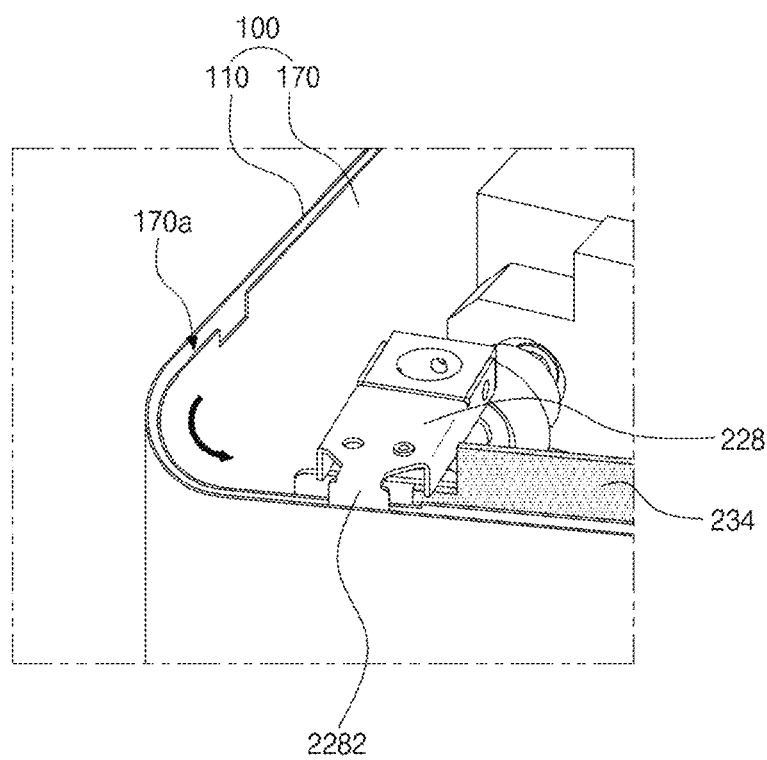
FIG. 16 is a view schematically illustrating a coupling relationship between the foldable display device and the rotational arm in the folded state according to an example embodiment of the present disclosure.
Figure 17:
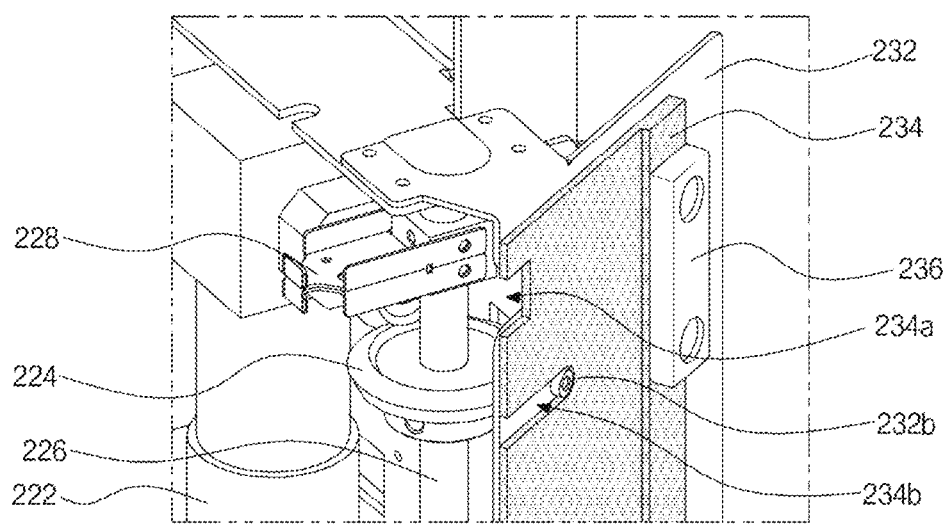
FIG. 17 is a view schematically illustrating a positional relationship between the rotational arm, the moving plate, and the magnetic unit in the unfolded state according to an example embodiment of the present disclosure.
Figure 18:
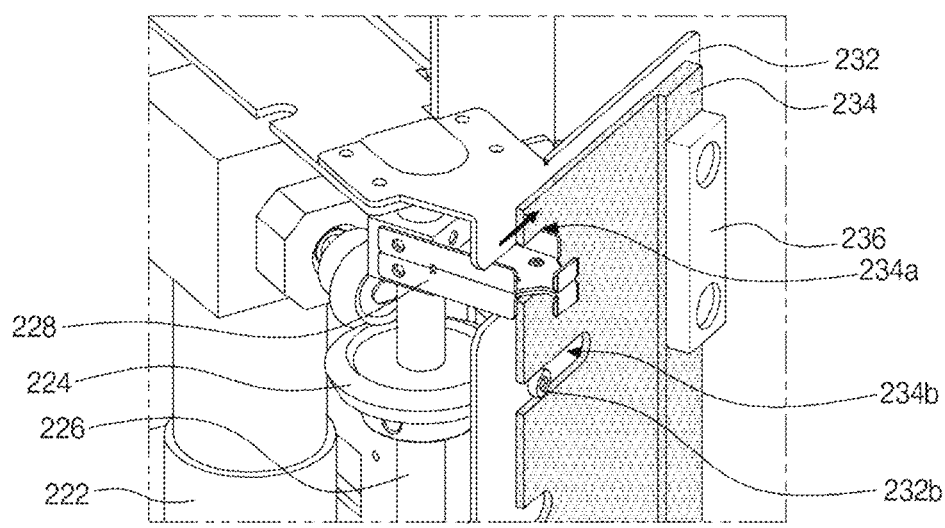
FIG. 18 is a view schematically illustrating a positional relationship between the rotational arm, the moving plate, and the magnetic unit in the folded state according to an example embodiment of the present disclosure.

FIG. 13 is a schematic top view of the foldable display device and the holder in the unfolded state according to an example embodiment of the present disclosure, and FIG. 14 is a schematic top view of the foldable display device and the holder in the folded state according to an example embodiment of the present disclosure. FIG. 15 is a view schematically illustrating a coupling relationship between the foldable display device 100 and the rotational arm 228 in the unfolded state according to an example embodiment of the present disclosure, and FIG. 16 is a view schematically illustrating a coupling relationship between the foldable display device 100 and the rotational arm 228 in the folded state according to an example embodiment of the present disclosure. FIG. 17 is a view schematically illustrating a positional relationship between the rotational arm 228, the moving plate 234, and the magnetic unit 236 in the unfolded state according to an example embodiment of the present disclosure, and FIG. 18 is a view schematically illustrating a positional relationship between the rotational arm 228, the moving plate 234, and the magnetic unit 236 in the folded state according to the embodiment of the present disclosure. Here, FIG. 15 and FIG. 16 correspond to cross-sections with respect to the second arm part 228b (see, e.g., FIG. 9) of the rotational arm 228, and for convenience of illustration, the foldable display device 100 is illustrated to include only the display panel 110 and the second back cover 170. In addition, the operation of one side of the foldable display device and the holder illustrated in FIG. 13 and FIG. 14 is described, and the other side thereof operates symmetrically with respect to the right side.

As shown in FIG. 13, FIG. 15, and FIG. 17, in the unfolded state, the foldable display device 100 may display an image, and the rotational arm 228 may be coupled to the foldable display device 100 with its length disposed parallel to the X direction and the second part 2282 facing the front plate 212. In this case, the second part 2282 of the rotational arm 228 may be coupled to the guide rail 170a of the second back cover 170, and the second part 2282 may be disposed between the display panel 110 and the second back cover 170.

In addition, the moving plate 234 may be spaced apart from the rotational arm 228 and be disposed on the first edge side of the fixing plate 232. Accordingly, the magnetic unit 236 fixed to the moving plate 234 may also be disposed in a first position, as illustrated, e.g., in FIG. 17.

Next, to move the foldable display device 100 from the unfolded state to the folded state, the rotational force generated by the motor 222 (shown, e.g., in FIG. 8) may be transmitted to the shaft 226 through the gear 224 (shown, e.g., in FIG. 8), and the shaft 226 may rotate in one direction. Accordingly, as shown in FIG. 14, FIG. 16, and FIG. 18, the rotational arm 228 fixed to the shaft 226 may also rotate. Here, the shaft 226 and the rotational arm 228 on the right side may rotate counterclockwise on the XY plane. At this time, the rotational arm 228 may rotate along the guide rail 170*a*. Thus, the foldable display device 100 coupled to the rotational arm 228 may be curved and be folded.

In this case, the rotated rotational arm 228 may be inserted into the moving hole 234*a* of the moving plate 234 to contact the moving plate 234 and may apply a counterclockwise force to the moving plate 234. The moving plate 234 may be moved from the first edge to the second edge of the fixing plate 232 by the force applied from the rotational arm 228. Accordingly, the magnetic unit 236 fixed to the moving plate 234 may also be moved and be placed in a second position, as illustrated, e.g., in FIG. 18.

In addition, a length of the restoration unit 238 fixed to the fixing plate 232 and the moving plate 234 may be increased by the movement of the moving plate 234, so that the restoration unit 238 may have an elastic force.

In this case, a distance between the magnetic unit 236 in the second position and the metal plate 180 (shown, e.g., in FIG. 4) on the rear surface of the second back cover 170 of the foldable display device 100 in the folded state may decrease so that the metal plate 180 may be fixed to the magnetic unit 236 by a strong magnetic force between the metal plate 180 and the magnetic unit 236. Thus, the foldable display device 100 may stably maintain the folded state.

On the other hand, when the foldable display device 100 in the folded state is changed to the unfolded state, the shaft 226 (shown, e.g., in FIG. 8) and the rotational arm 228 on the right side may rotate clockwise on the XY plane due to the rotational force generated by the motor 222 (shown, e.g., in FIG. 8). Accordingly, the foldable display device 100 coupled to the rotational arm 228 may be unfolded by a repulsive force.

In addition, the counterclockwise force applied by the rotational arm 228 to the moving plate 234 may be removed, and the moving plate 234 may be moved from the second edge to the first edge of the fixing plate 232 by the elastic force of the restoration unit 238. Accordingly, the magnetic unit 236 fixed to the moving plate 234 may also be moved and be placed in the first position again. In this case, the distance between the magnetic unit 236 in the first position and the metal plate 180 (shown, e.g., in FIG. 4) on the rear surface of the second back cover 170 of the foldable display device 100 may increases, and the magnetic force between the metal plate 180 and the magnetic unit 236 may be weakened. Accordingly, the foldable display device 100 may easily be unfolded.

As described above, by using the rotational arm 228, the fixing plate 232, the moving plate 234, and the magnetic unit 236, the foldable display device 100 according to an example embodiment of the present disclosure may be easily unfolded and folded and may stably maintain the folded state.

In the present disclosure, the foldable display device having a relatively large size may be easily changed into the unfolded state and the folded state by using the holding system.

In addition, by fixing the foldable display device in the folded state using the magnetic unit whose position may be changed, it is possible to stably maintain the foldable display device having a relatively large size in the folded state.

Example embodiments of the present disclosure can also be described as follows:

A foldable display set according to an example embodiment of the present disclosure may include: a foldable display device; and a holding system on a rear surface of the foldable display device and configured to fold and unfold the foldable display device. Here, the holding system includes: a motor configured to generate a rotational force; a rotational arm configured to be rotated by the rotational force of the motor to fold and unfold the foldable display device; a fixing plate spaced apart from the rotational arm with the foldable display device in an unfolded state; a moving plate on the fixing plate and configured to be moved with respect to the fixing plate by the rotational arm; and a magnetic unit fixed on the moving plate. Also, the foldable display device in a folded state may be fixed to the magnetic unit via a magnetic force.

In some example embodiments, the foldable display device may include a metal plate on the rear surface of the foldable display device, and the metal plate may be fixed to the magnetic unit via the magnetic force with the foldable display device in the folded state.

In some example embodiments, the foldable display device may include a guide rail on the rear surface of the foldable display device, and the rotational arm may be coupled to the guide rail and is configured to rotate along the guide rail to fold and unfold the foldable display device.

In some example embodiments, the fixing plate may include a fixing hole and a fixing protrusion, and the moving plate may include a moving hole and a protrusion hole. The moving hole may be disposed over the fixing hole, and the fixing protrusion may be disposed in the protrusion hole.

In some example embodiments, each of the fixing hole and the moving hole may be open on one side, and the moving hole may have a smaller width than the fixing hole horizontally.

In some example embodiments, the rotational arm may be configured to be disposed in the fixing hole and the moving hole and to rotate in the fixing hole to move the moving plate to move the foldable display device to the folded state.

In some example embodiments, the holding system may further include: a shaft configured to be rotated by the rotational force of the motor, the rotational arm being connected to the shaft; and a gear for transmitting the rotational force of the motor to the shaft.

In some example embodiments, the holding system may further include a frame to house at least the motor, and the fixing plate may be connected to the frame.

In some example embodiments, with the foldable display device in the unfolded state, the moving plate and the magnetic unit may be in a first position with respect to the fixing plate. With the foldable display device in the folded state, the moving plate and the magnetic unit may be in a second position with respect to the fixing plate, the magnetic unit being fixed to the foldable display device.

In some example embodiments, the magnetic unit may not be fixed via the magnetic force to the foldable display device in the unfolded state.

In some example embodiments, the holding system may further include a restoration unit having one end connected to the fixing plate and another end connected to the moving plate. The restoration unit may have a greater length with the moving plate and the magnetic unit in the second position than in the first position.

In some example embodiments, the holding system may further include a front plate between the motor and the foldable display device, and the foldable display device may be fixed to the front plate.

In some example embodiments, the front plate of the holding system may be fixed to a center portion of the foldable display device in the unfolded state and in the folded state.

In some example embodiments, the rotational arm may be configured to be rotated by the rotational force of the motor to fold and unfold a lateral side portion of the foldable display device, and the magnetic unit may be fixed via the magnetic force to the lateral side portion of the foldable display device in the folded state.

In another example embodiment of the present disclosure, a holding system for a foldable display device may include: a frame; a motor housed in the frame and configured to generate a rotational force; a rotational arm configured to be rotated by the rotational force of the motor; a fixing plate connected to the frame and spaced apart from the rotational arm; a moving plate on the fixing plate and configured to be moved with respect to the fixing plate by the rotational arm; and a magnetic unit fixed on the moving plate, wherein the moving plate and the magnetic unit may be configured to be moved by the rotational arm between a first position and a second position with respect to the fixing plate.

In some example embodiments, the holding system may further include: a restoration unit having one end connected to the fixing plate and another end connected to the moving plate, wherein the restoration unit may have a greater length with the moving plate and the magnetic unit in the second position than in the first position.

In some example embodiments, the fixing plate may include a fixing hole and a fixing protrusion, and the moving plate may include a moving hole and a protrusion hole. The moving hole may be disposed over the fixing hole, and the fixing protrusion may be disposed in the protrusion hole.

In some example embodiments, each of the fixing hole and the moving hole may be open on one side, and the moving hole may have a smaller width than the fixing hole horizontally.

In some example embodiments, the rotational arm may be configured to be disposed in the fixing hole and the moving hole and to rotate in the fixing hole to move the moving plate from the first position to the second position.

In some example embodiments, the holding system may further include: a shaft configured to be rotated by the rotational force of the motor, the rotational arm being connected to the shaft; and a gear for transmitting the rotational force of the motor to the shaft.

It will be apparent to those skilled in the art that various modifications and variations can be made in the holding system and the display device of the present disclosure without departing from the technical idea or scope of the disclosure. Thus, it is intended that embodiments of the present disclosure cover the modifications and variations of the disclosure provided they come within the scope of the appended claims and their equivalents.

What is claimed is:

1. A foldable display set, comprising:
a foldable display device; and
a holding system on a rear surface of the foldable display device and configured to fold and unfold the foldable display device,
wherein the holding system includes:
a motor configured to generate a rotational force;
a rotational arm configured to be rotated by the rotational force of the motor to fold and unfold the foldable display device;
a fixing plate spaced apart from the rotational arm with the foldable display device in an unfolded state;
a moving plate on the fixing plate and configured to be moved with respect to the fixing plate by the rotational arm; and
a magnetic unit fixed on the moving plate, and
wherein the foldable display device in a folded state is fixed to the magnetic unit via a magnetic force, and
wherein the moving plate is disposed between the fixing plate and the magnetic unit.

2. A foldable display set, comprising:
a foldable display device; and
a holding system on a rear surface of the foldable display device and configured to fold and unfold the foldable display device,
wherein the holding system includes:
a motor configured to generate a rotational force;
a rotational arm configured to be rotated by the rotational force of the motor to fold and unfold the foldable display device;
a fixing plate spaced apart from the rotational arm with the foldable display device in an unfolded state;
a moving plate on the fixing plate and configured to be moved with respect to the fixing plate by the rotational arm; and
a magnetic unit fixed on the moving plate, and
wherein the foldable display device in a folded state is fixed to the magnetic unit via a magnetic force,
wherein the foldable display device includes a metal plate on the rear surface of the foldable display device, and
wherein the metal plate is fixed to the magnetic unit via the magnetic force with the foldable display device in the folded state.

3. The foldable display set of claim 1, wherein the foldable display device includes a guide rail on the rear surface of the foldable display device, and
wherein the rotational arm is coupled to the guide rail and is configured to rotate along the guide rail to fold and unfold the foldable display device.

4. The foldable display set of claim 1, wherein the fixing plate includes a fixing hole and a fixing protrusion,
wherein the moving plate includes a moving hole and a protrusion hole, and
wherein the moving hole is disposed over the fixing hole, and the fixing protrusion is disposed in the protrusion hole.

5. The foldable display set of claim 4, wherein each of the fixing hole and the moving hole is open on one side, and the moving hole has a smaller width than the fixing hole horizontally.

6. The foldable display set of claim 5, wherein the rotational arm is configured to be disposed in the fixing hole and the moving hole and to rotate in the fixing hole to move the moving plate to move the foldable display device to the folded state.

7. The foldable display set of claim 1, wherein the holding system further includes:
a shaft configured to be rotated by the rotational force of the motor, the rotational arm being connected to the shaft; and
a gear for transmitting the rotational force of the motor to the shaft.

8. The foldable display set of claim 1, wherein the holding system further includes a frame to house at least the motor, and
wherein the fixing plate is connected to the frame.

9. The foldable display set of claim 1, wherein:
with the foldable display device in the unfolded state, the moving plate and the magnetic unit are in a first position with respect to the fixing plate, and
with the foldable display device in the folded state, the moving plate and the magnetic unit are in a second position with respect to the fixing plate, the magnetic unit being fixed to the foldable display device.

10. The foldable display set of claim 9, wherein the magnetic unit is not fixed via the magnetic force to the foldable display device in the unfolded state.

11. The foldable display set of claim 9, wherein the holding system further includes a restoration unit having one end connected to the fixing plate and another end connected to the moving plate, and
wherein the restoration unit has a greater length with the moving plate and the magnetic unit in the second position than in the first position.

12. The foldable display set of claim 1, wherein the holding system further includes a front plate between the motor and the foldable display device, and the foldable display device is fixed to the front plate.

13. The foldable display set of claim 12, wherein the front plate of the holding system is fixed to a center portion of the foldable display device in the unfolded state and in the folded state.

14. The foldable display set of claim 1, wherein the rotational arm is configured to be rotated by the rotational force of the motor to fold and unfold a lateral side portion of the foldable display device, and
wherein the magnetic unit is fixed via the magnetic force to the lateral side portion of the foldable display device in the folded state.

15. A holding system for a foldable display device, the holding system comprising:
a frame;
a motor housed in the frame and configured to generate a rotational force;
a rotational arm configured to be rotated by the rotational force of the motor;
a fixing plate connected to the frame and spaced apart from the rotational arm;
a moving plate on the fixing plate and configured to be moved with respect to the fixing plate by the rotational arm; and
a magnetic unit fixed on the moving plate,
wherein the moving plate and the magnetic unit are configured to be moved by the rotational arm between a first position and a second position with respect to the fixing plate, and
wherein the moving plate is disposed between the fixing plate and the magnetic unit.

16. The holding system of claim 15, further comprising:
a restoration unit having one end connected to the fixing plate and another end connected to the moving plate,
wherein the restoration unit has a greater length with the moving plate and the magnetic unit in the second position than in the first position.

17. The holding system of claim 15, wherein the fixing plate includes a fixing hole and a fixing protrusion,
wherein the moving plate includes a moving hole and a protrusion hole, and
wherein the moving hole is disposed over the fixing hole, and the fixing protrusion is disposed in the protrusion hole.

18. The holding system of claim 17, wherein each of the fixing hole and the moving hole is open on one side, and the moving hole has a smaller width than the fixing hole horizontally.

19. The holding system of claim 17, wherein the rotational arm is configured to be disposed in the fixing hole and the moving hole and to rotate in the fixing hole to move the moving plate from the first position to the second position.

20. The holding system of claim 15, further comprising:
a shaft configured to be rotated by the rotational force of the motor, the rotational arm being connected to the shaft; and
a gear for transmitting the rotational force of the motor to the shaft.

21. The holding system of claim 15, wherein the magnetic unit is fixed directly on the moving plate through a screw or an adhesive member.

22. The foldable display set of claim 1, wherein the magnetic unit is fixed directly on the moving plate through a screw or an adhesive member.

* * * * *